US006795943B2

(12) United States Patent
Sato et al.

(10) Patent No.: US 6,795,943 B2
(45) Date of Patent: Sep. 21, 2004

(54) SEMICONDUCTOR DEVICE WITH TEST MODE

(75) Inventors: Hirotoshi Sato, Hyogo (JP); Masaki Tsukude, Hyogo (JP); Ryu Makabe, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 371 days.

(21) Appl. No.: 09/973,894

(22) Filed: Oct. 11, 2001

(65) Prior Publication Data

US 2002/0149013 A1 Oct. 17, 2002

(30) Foreign Application Priority Data

Apr. 12, 2001 (JP) ........................................ 2001-113535

(51) Int. Cl.[7] .............................................. G01R 31/28
(52) U.S. Cl. ...................................... 714/718; 714/734
(58) Field of Search ................................ 714/718, 719, 714/743, 738, 739, 710, 711, 763; 365/230.01, 230.02, 189.01, 200, 201, 230.06

(56) References Cited

U.S. PATENT DOCUMENTS 5,034,923 A * 7/1991 Kuo et al. ............. 365/189.01
5,416,740 A * 5/1995 Fujita et al. ................ 365/200
6,310,807 B1 * 10/2001 Ooishi et al. ............... 365/200

FOREIGN PATENT DOCUMENTS

JP 08-031197 2/1996

* cited by examiner

Primary Examiner—Christine T. Tu
(74) Attorney, Agent, or Firm—McDermott Will & Emery LLP (57) ABSTRACT

A semiconductor memory includes a first decoder selecting any of modes 1–n of a test mode B according to first to fourth data signals, and a second decoder selecting any of modes 1–n of the test mode B according to fifth to eighth data signals. When a predetermined mode m+1 is not set in a test mode A, the mode selected by both the first and second decoders is set. When the predetermined mode m+1 is set, the mode selected by the first decoder is set. Therefore, the test mode B can be set at the manufacturer side by connecting only four data input/output terminals to the tester.

7 Claims, 11 Drawing Sheets

SEMICONDUCTOR DEVICE WITH TEST MODE

BACKGROUND OF THE INVENTION

1. Field of the Invention

The present invention relates to semiconductor devices, particularly to a semiconductor device with a plurality of first test modes and a plurality of second test modes.

2. Description of the Background Art

Semiconductor memories such as DRAMs and SRAMs are conventionally provided with a test mode to carry out an operation in addition to the normal write/read operation. The test mode is mainly classified into a test mode A carried out at the manufacturer side and a test mode B carried out at the user side.

At the manufacturer side, only four data input/output terminals among 16 data input/output terminals, for example, of a semiconductor memory are connected to the tester for testing in order to increase the number of semiconductor memories that can be tested simultaneously by one tester to reduce the test cost. Specification of test mode A is effected without using the data input/output terminal.

Figure 12:
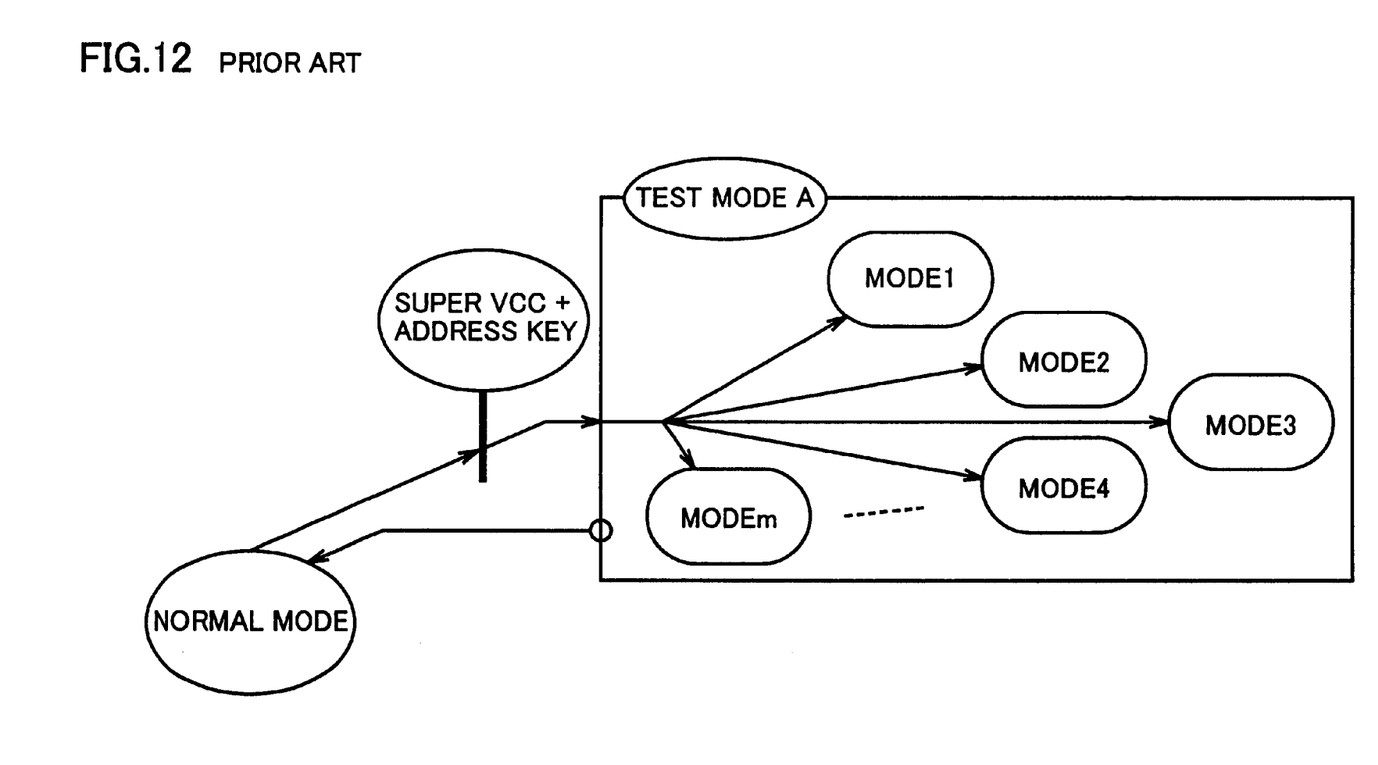
FIGS. 12 and 13 show the methods of setting test mode A and test mode B, respectively, of a conventional semiconductor memory.

FIG. 12 shows a method of setting test mode A. Referring to FIG. 12, transition from the normal mode of the general write/read operation to test mode A is effected by applying to a terminal a high super VCC potential SVIH that is sufficiently higher than a power supply potential VCC and the so-called address key. Test mode A includes m (m is an integer of at least 2) modes 1–m. Upon entering test mode A, any of modes 1–m is selected and executed. Transition from test mode A to the normal mode is effected by executing a test mode reset sequence.

At the user side, the test mode is set in the normal usage status where all the 16 data input/output terminals are connected to, for example, a memory controller. It is difficult to obtain additionally a power supply for super VCC potential SVIH at the user side. Accordingly, specification of test mode B is effected using the data input/output terminal.

Figure 13:
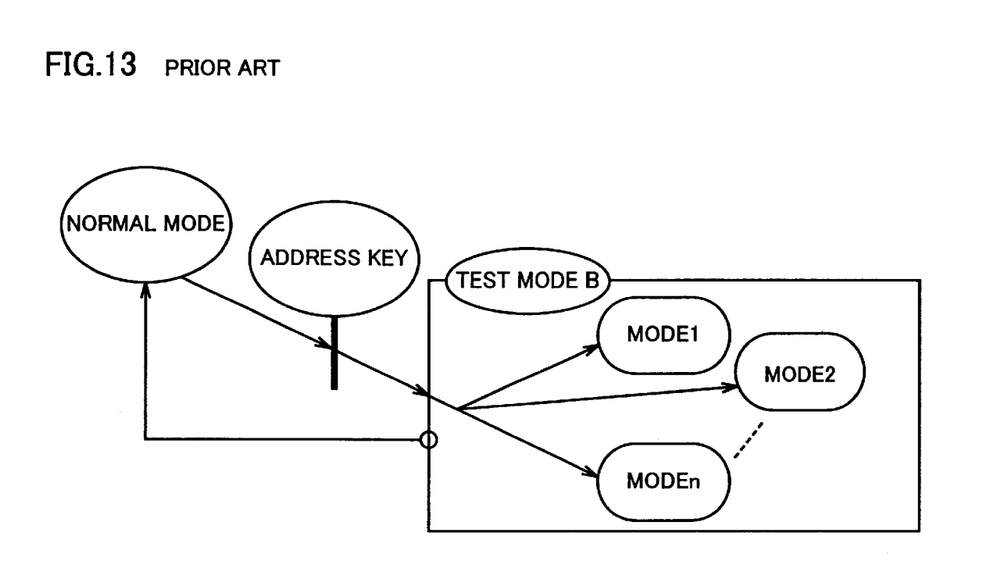

FIG. 13 shows a method of setting test mode B. Referring to FIG. 13, transition from the normal mode to test mode B is effected by entering an address key. Test mode B includes n (here, n is an integer of at least 2) modes 1–n. After entering test mode B, any of modes 1–n is selected and executed using 8 data input/output terminals in addition to the address key. Transition from test mode B to the normal mode is effected by executing a test mode reset sequence.

It is to be noted that in the conventional method of setting test modes A and B, only 4 out of sixteen data input/output terminals of a semiconductor memory are connected to the tester for testing at the manufacturer side. There was a problem that test mode B that uses 8 data input/output terminals cannot be set.

SUMMARY OF THE INVENTION

In view of the foregoing, a main object of the present invention is to provide a semiconductor device that can easily have a user-oriented test mode set using a tester.

According to an aspect of the present invention, a semiconductor device includes a first select circuit selecting any of a plurality of first test modes according to a signal applied via a plurality of first signal terminals, a second select circuit selecting any of a plurality of second test modes according to a signal applied via a plurality of second signal terminals, a third select circuit selecting any of the plurality of second test modes according to a signal applied via a plurality of third signal terminals, a fourth select circuit selecting a second test mode selected by both the second and third select circuits when a control signal is at a first level, and selecting a second test mode selected by the second select circuit when the control signal is at the second level, and a test mode execution circuit executing a first test mode selected by the first select circuit and a second test mode selected by the fourth select circuit. Therefore, by providing a plurality of first signal terminals and a plurality of second signal terminals to the tester, and setting the control signal at the second level, a desired second test mode can be executed without having to connect a plurality of third signal terminals to the tester. Therefore, a second test mode for the user can be easily executed using the tester.

Preferably, the first select circuit drives the control signal to the second level when a predetermined first test mode is selected among the plurality of first test modes, and drives the control signal to the first level when a first test mode other than the predetermined first test mode is selected. In this case, the control signal can be driven to the second level by selecting a predetermined first test mode.

Preferably a fourth signal terminal to input a control signal is provided. In this case, the level of the control signal can be set easily from an external source via the fourth signal terminal.

Preferably, the semiconductor device further includes a first signal generation circuit driving a first activation signal to an activation level in response to application of a predetermined first signal via a plurality of first signal terminals, and a second signal generation circuit driving a second activation signal to the activation level in response to application of a predetermined second signal via the plurality of first signal terminals. The first select circuit is rendered active in response to activation of the first activation signal. The second and third select circuits are rendered active in response to activation of the second activation signal. Here, the first select signal is rendered active only in the case where the predetermined first signal is input, and the second and third select circuits are rendered active only when the predetermined second signal is input. Therefore, the problem of a test mode being accidentally set can be prevented.

Further preferably, the semiconductor device includes a reset circuit resetting the first signal generation circuit in response to selection of any of the plurality, of second test modes and driving the first activation signal to an inactivation level. Since the first test mode is canceled in response to selection of the second test mode, the second test mode can be executed with priority over the first test mode.

Preferably, the reset circuit does not reset the first signal generation circuit when the control signal is at the second level. This can prevent the first signal generation circuit from being reset to cancel the first test mode when the control signal is driven to the second level by a predetermined first test mode.

Preferably, the semiconductor device is a semiconductor memory device. The semiconductor memory device includes a plurality of memory circuits, each preassigned with a unique address signal, a decoder selecting any of the plurality of memory circuits according to an address signal applied through a plurality of first signal terminals, and a data input/output circuit that transfers a data signal between a plurality of second and third signal terminals and a memory circuit selected by the decoder. The present invention is particularly advantageous in such a case.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
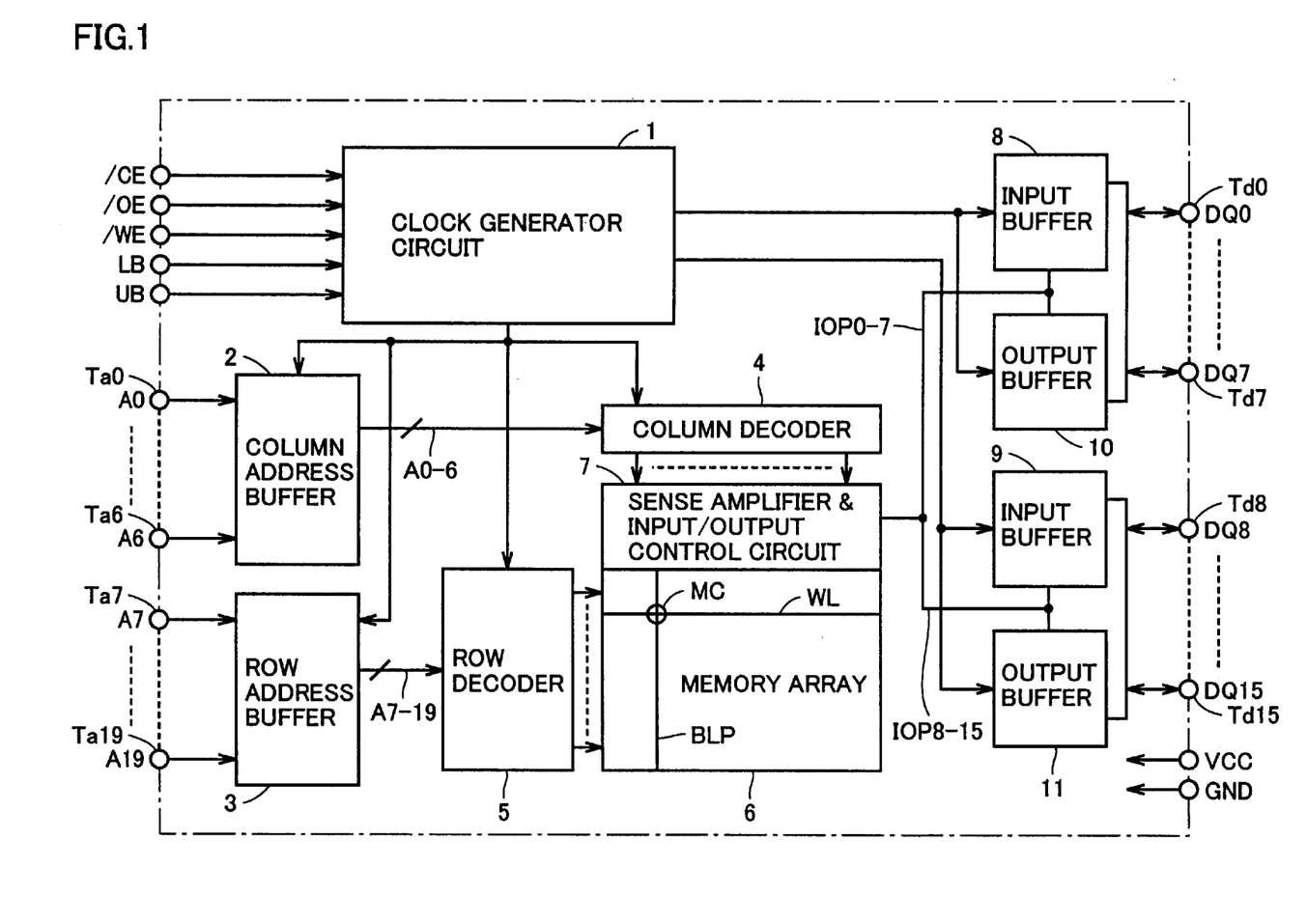
FIG. 1 is a block diagram showing an entire structure of a semiconductor memory according to a first embodiment of the present invention.

FIG. 1 is a block diagram showing an entire structure of a semiconductor memory according to a first embodiment of the present invention. Referring to FIG. 1, the semiconductor memory includes a clock generation circuit 1, a column address buffer 2, a row address buffer 3, a column decoder 4, a row decoder 5, a memory array 6, a sense amplifier & input/output control circuit 7, input buffers 8 and 9, and output buffers 10 and 11. Clock generation circuit 1 selects a predetermined operation mode according to externally applied chip enable signal /CE, output permit signal /OE, input permit signal /WE, lower level buffer activation signal LB, and upper buffer activation signal UB to provide entire control of the semiconductor memory.

Column address buffer 2 transmits externally applied address signals A0–A6 through address signal input terminals Ta0–Ta6 to column decoder 4. Row address buffer 3 transmits externally applied address signals A7–A19 through address signal input terminals Ta7–Ta19 to row decoder 5. Memory array 6 includes a plurality of memory cells arranged in a plurality of rows and columns, a word line WL provided corresponding to each row, and a bit line pair BLP provided corresponding to each column. Memory cell MC is a dynamic type memory cell, storing data of 1 bit. Bit line pair BLP is grouped for every 16 pairs in advance.

Column decoder 4 selects any of the plurality of bit line pair groups according to address signals A0–A6 from column address buffer 2. Row decoder 5 selects any of the plurality of word lines WL according to address signals A7–A19 from row address buffer 3 to render active each memory cell MC corresponding to the selected word line WL.

Sense amplifier & input/output control circuit 7 connects the 16 pairs of bit lines BLP of the group selected by column decoder 4 to one end of data input/output line pairs IOP0–IOP15, respectively. The other ends of data input/output line pairs IOP0–IOP7 are connected to input buffer 8 and output buffer 10. The other ends of data input/output line pairs IOP8–IOP15 are connected to input buffer 9 and output buffer 11. Buffers 8 and 10 are rendered active in response to signal LB driven to an activation level of "H". Buffers 9 and 11 are rendered active in response to signal UB driven to an activation level of "H".

In response to signals /CE and /WE both driven to an activation level of "L", input buffers 8 and 9 provide data D0–D7 and D8–D15 input through data input/output terminals Td0–Td7 and Td8–Td15 to the 16 memory cells MC selected through data input/output line pairs IOP0–IOP7 and IOP8–IOP15, respectively. In response to signals /CE and /OE both driven to an activation level of "L", output buffers 10 and 11 output data Q0–Q7 and Q8–Q15 read out from the 16 selected memory cells MC through data input/output terminals Td0–Td7 and Td8–Td15.

A method of setting test modes A and B characteristic of the present semiconductor memory will be described with reference to FIG. 2.

Figure 2:
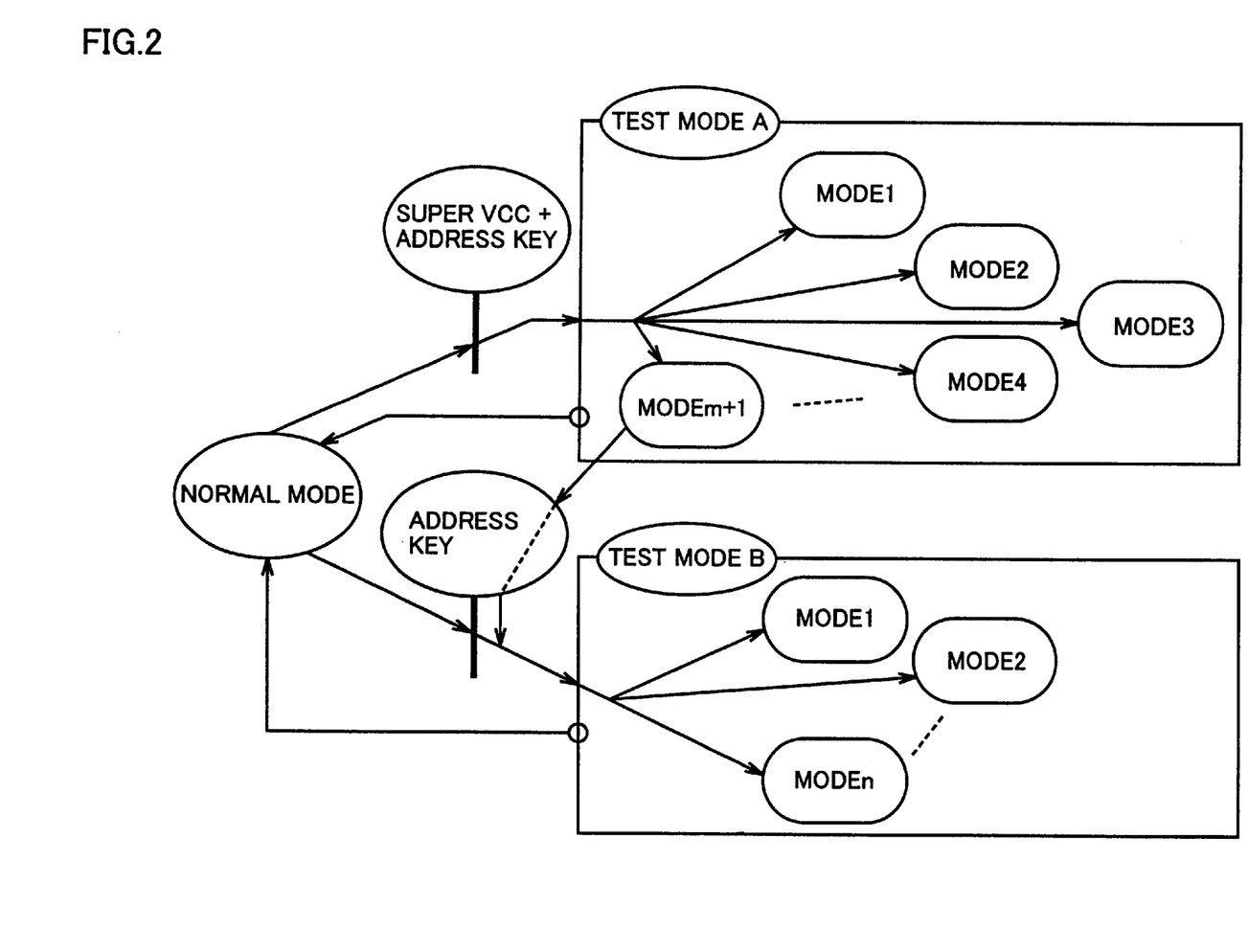
FIG. 2 shows the method of setting test modes A and B of the semiconductor memory of FIG. 1.

Referring to FIG. 2, transition from the normal mode to test mode A is effected by the application of super VCC potential SVIH and input of the address key. Test mode A includes m+1 modes 1 to m+1. Modes 1–m include the degeneration mode to test 16 memory cells through 4 data input/output terminals, and the mode to directly control the internal circuitry of the semiconductor memory from an external source. Mode m+1 is the mode to change to test mode B from test mode A. Following the entry into test mode A, any of modes 1 to m+1 is selected and executed. When test mode m+1 is selected, transition from test mode A to test mode B is effected. Transition from test mode A to the normal mode is effected by executing a test mode A reset sequence.

Transition from the normal mode to test mode B is effected by entering an address key. Test mode B includes n modes 1–n. Modes 1–n include a mode to completely reset the internal circuitry of the semiconductor device, and the power down mode to set power consumption of the semiconductor memory lower than that of the normal level. Upon entering test mode B, any of modes 1–n is selected and executed. Transition from test mode B to the normal mode is effected by executing a test mode B reset sequence.

Figure 3:
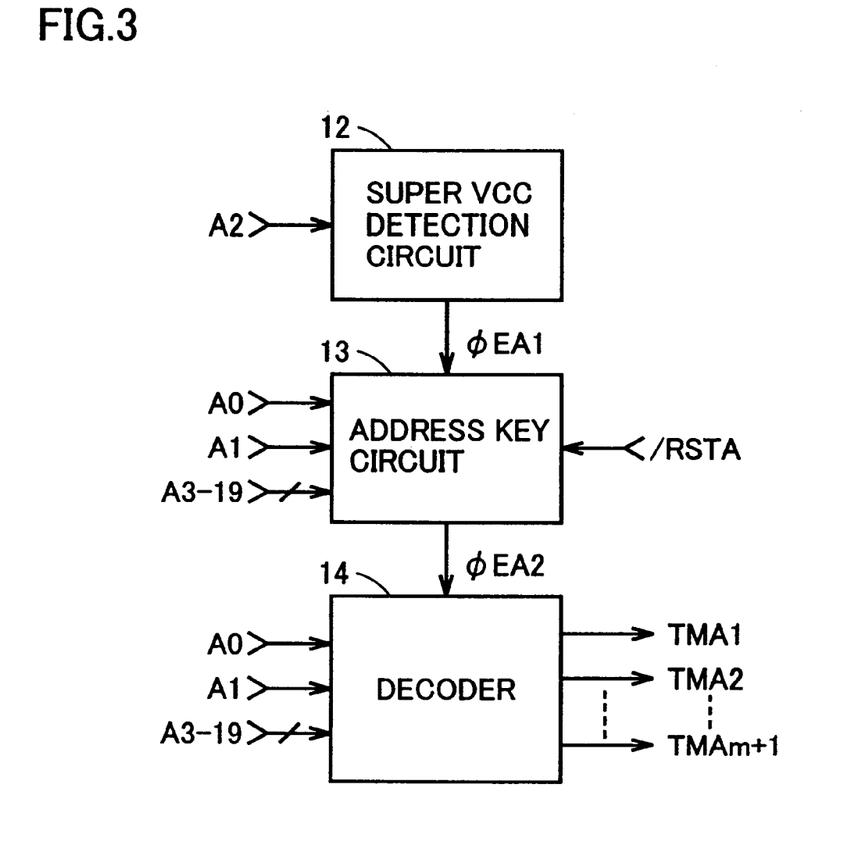
FIG. 3 is a block diagram of the portion related to setting test mode A of the semiconductor memory of FIG. 1.

FIG. 3 is a block diagram showing the portion related to setting test mode A. Referring to FIG. 3, the semiconductor memory includes, in addition to the structure shown in FIG. 1, a super VCC detection circuit 12, an address key circuit 13 and a decoder 14. Super VCC detection circuit 12 drives a signal φEA1 to an activation level of "H" in response to application of super VCC potential SVIH to a terminal Ta2 for address signal A2. Address signal A2 takes the binary of an H level (power supply potential VCC) and an L level (ground potential GND). Super VCC detection circuit 12 drives signal φEA to an inactivation level of L during the period where address signal A2 is input.

Address key circuit 13 is rendered active in response to signal φEA1 driven to an activation level of "H", and drives signal φEA2 to an activation level of H in response to input of address signals A0, A1 and A3–A19 in a predetermined status (combination and sequence of logic level). Accordingly, the semiconductor memory device enters test mode A. Address key circuit 13 is reset in response to a reset signal /RSTA driven to an activation level of L. Upon execution of the test mode A reset sequence, reset signal /RSTA is driven to an activation level of L.

Decoder 14 is rendered active in response to signal φEA2 driven to an activation level of H, and selects any of test mode signals TMA1–TMAm+1 according to address signals A0, A1, and A3–A19 to drive the selected signal to an activation level of H. When test mode signals TMA1 to TMAm+1 are driven to an activation level of H, modes 1 to m+1 of test mode A is selected, respectively.

FIGS. 4A–4H are timing charts of the method of setting test mode A. In FIGS. 4A–4H, the terminals for external control signals /CE, AWE, /OE, LB and UB of the semiconductor memory, the terminal for address signals A0–A19, and four data input terminals Td0–Td3 among the 16 data input/output terminals Td0–Td15 are connected to the tester. It is to be noted that data input/output terminals Td0–Td3 are not used and set to a high impedance state in the entry and setting of test mode A.

In the entry and testing of test mode A, signal /WE is fixed at the inactivation level of H. Signals LB and UB are both fixed at the inactivation level of L. Signals /CE and /OE are both clock signals of a predetermined frequency. During a test mode entry period 1 (time t0–t1), super VCC potential SVIH is applied to terminal Ta2 for address signal A2. Also, address signals A0, A1 and A3–A19 are input 8 times at a predetermined combination and sequence. At the next test mode entry period 2 (time t1–t2), super VCC potential SVIH is applied to address signal A2 terminal Ta2, and address signals A0, A1 and A3–A19 are input 8 times in a predetermined combination and sequence. When a predetermined condition is met in test mode entry periods 1, 2, the semiconductor memory device enters test mode A. Output signal φEA2 of address related circuit 16 shown in FIG. 3 is driven to an activation level of H, whereby decoder 14 is rendered active.

At the test mode set period (time t2–t3), super VCC potential SVIH is applied to address signal A2 terminal Ta2, and address signals A0, A1 and A3–A19 are input two times in a predetermined combination and sequence depending on the desired mode. Accordingly, any of test mode signals TMA1 to TMAm+1 is selected by decoder 14. The selected signal is driven to an activation level of H, whereby the mode corresponding to that signal is set. Then, the set test mode is executed by clock generation circuit 1 and the like (time t3-).

Figure 5:
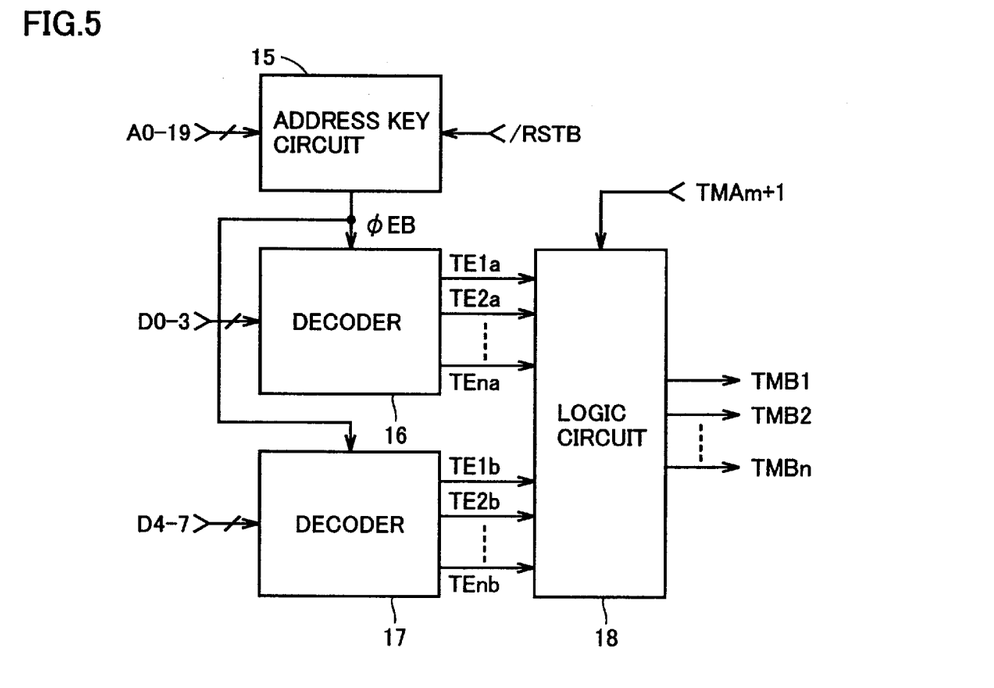
FIG. 5 is a block diagram showing the portion related to setting test mode B of the semiconductor memory of FIG. 1.

FIG. 5 is a block diagram showing the portion related to setting test mode B. Referring to FIG. 5, the semiconductor memory includes, in addition to the structure shown in FIGS. 1 and 3, an address key circuit 15, decoders 16 and 17, and a logic circuit 18. Address key circuit 15 drives signal φEB to an activation level of H in response to the input of address signals A0–A19 in a predetermined status (combination and sequence of logic level). In response, the semiconductor memory enters test mode B. Address key circuit 15 is reset in response to reset signal /RSTB driven to an activation level of L. In response to execution of the test mode B reset sequence, reset signal /RSTB is driven to an activation level of L.

Decoder 16 is rendered active in response to signal φEB driven to an activation level of H to select any of signals TE1a–TEna according to data signals D0–D3. The selected signal is driven to an activation level of H. Decoder 17 is rendered active in response to signal φEB driven to an activation level of H to select any of signals TE1b–TEnb according to data signals D4–D7. The selected signal is driven to an activation level of H.

When signal TMAm+1 from decoder 14 of FIG. 3 is at an inactivation level of L, logic circuit 18 renders test mode signals TMB1, TMB2, . . . , TMBn to an activation level of H in response to signals TE1a and TE1b, TE2a and TE2b, . . . , TEna and TEnb both driven to an H level. When signal TMAm+1 is at an activation level of H, logic circuit 18 sets signals TE1a–TEnb as test mode signals TMB1–TMBn, respectively, irrespective of signals TE1b–TEnb.

Figure 6:
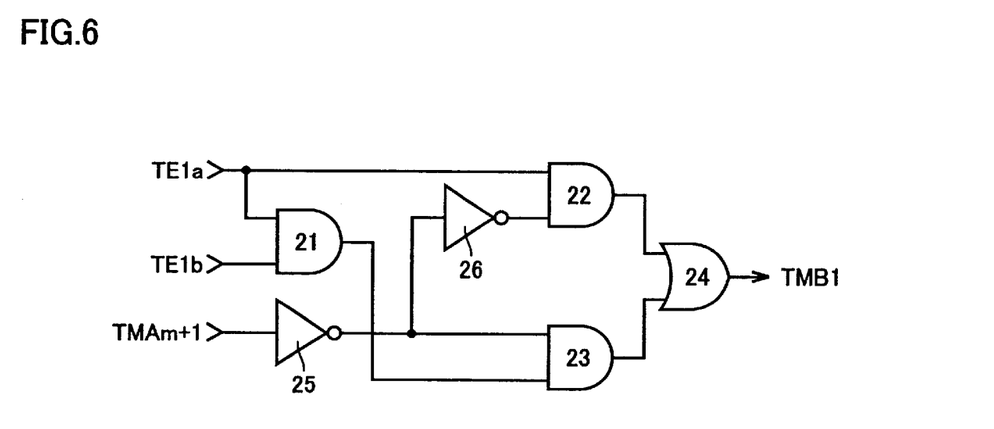
FIG. 6 is a circuit diagram showing a main part of the logic circuit of FIG. 5.

FIG. 6 is a circuit diagram of the portion related to test mode signal TMB1 of logic circuit 18. Referring to FIG. 6, logic circuit 18 includes AND gates 21–23, an OR gate 24, and inverters 25 and 26. Signal TMAm+1 is applied to the one input node of AND gate 22 through inverters 25 and 26 and to one input node of AND gate 23 through inverter 25. Signal TE1a is applied to the other input node of AND gate 22. AND gate 21 receives signals TE1a and TE1b. The signal output from AND gate 21 is applied to the other input node of AND gate 23. OR gate 24 receives the signals output from AND gates 22 and 23. The output signal of OR gate 24 corresponds to test mode signal TMB1.

When signal TMAm+1 is at an inactivation level of L, the output signal of inverter 26 is pulled down to an L level. The output signal of AND gate 22 is fixed at an L level. The output signal of AND gate 21 passes through AND gate 23 and OR gate 24 to become test mode signal TMB1. Therefore, test mode signal TMB1 is the ANDed signal of signals TE1a and TE1b.

When signal TMAm+1 is at an activation level of H, the output signal of inverter 25 is pulled down to an L level. The output signal of AND gate 23 is fixed at an L level. Signal TE1a passes through AND gate 22 and OR gate 24 to become test mode signal TMB1. The portion related to each of test mode signals TMB2–TMBn of logic circuit 18 is similar to the portion related to test mode signal TMB1.

FIGS. 7A–7G are timing charts of the method of setting test mode B. In FIGS. 7A–7G, all the terminals of the semiconductor memory are connected to a memory controller or the like when test mode B is set at the user side. In the entry and setting of test mode B, signals LB and UB are fixed at an inactivation level of L.

In the test mode entry period (time t0–t1), signal /WE is fixed at the inactivation level of H. Signals /CE and /OE both become clock signals of a predetermined frequency. Address signals A0–A19 are input for the period of 4 cycles in a predetermined combination. When a predetermined condition is met during the test mode entry period, the semiconductor memory enters test mode B. Signal φEB output from address key circuit 15 shown in FIG. 5 is driven to an activation level of H, whereby decoders 16 and 17 are rendered active.

At the next test mode set period (time t1–t2), signal /OE is fixed at an inactivation level of H. Signals /CE and /WE function as clock signals. Address signals A0–A19 are input for the period of 2 cycles in a predetermined combination. Also, data signals D0–D7 are input for the period of two cycles in a predetermined combination and sequence. Accordingly, any of signals TE1a–TEna is driven to an activation level of H by decoder 16. Also, any of signals TE1b–TEnb is driven to an activation level of H by decoder 17.

When test mode B is set at the user side, signal TMAm+1 is at an inactivation level of L. Therefore, logic circuit 18 drives the signal (here, TMBn) corresponding to signals that are both of an H level for signals TE1a and TE1b, TE2a and TE2b, . . . , TEna and TEnb (for example TEna and TEnb) to an activation level of H. When signal TMBn attains an H level, mode n is set (time t2). Then, mode n is executed by clock generation circuit 1 and the like (time t2-).

Figure 4A:
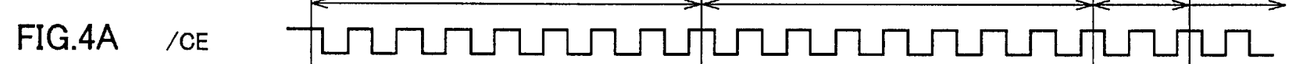
FIGS. 4A–4H are timing charts of the method of setting test mode A of the semiconductor memory of FIG. 1.
Figure 4B:
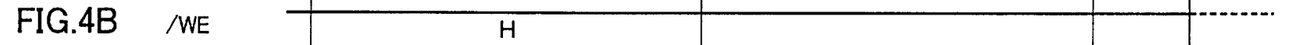
Figure 4C:
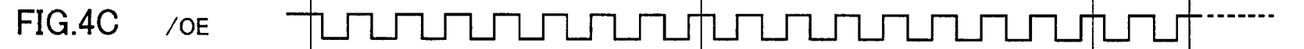
Figure 4D:
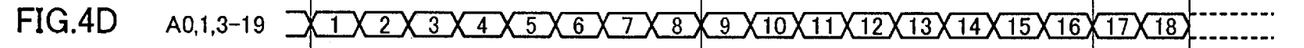
Figure 4E:
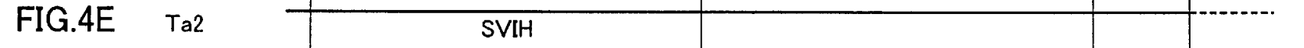
Figure 4F:
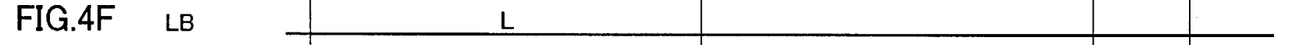
Figure 4G:
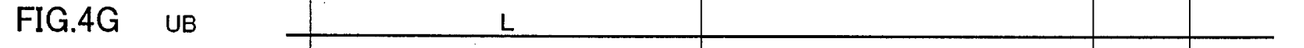
Figure 4H:
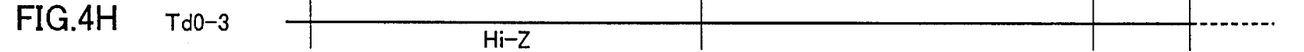

When test mode B is set at the manufacturer side, the terminals for external control signals /CE, /WE, /OE, LB and UB, terminals Ta0–Ta19 for address signals A0–A19, and four data input/output terminals Td0–Td3 from the 16 data input/output terminals Td0–Td15 are connected to the tester. First, mode m+1 of test mode A is set by the method described with reference to FIG. 4. Then, test mode signal TMAm+1 is driven to an activation level of H.

Figure 7A:
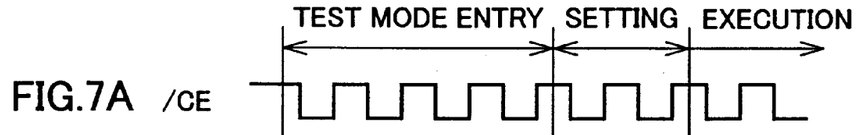
FIGS. 7A–7G are timing charts of the method of setting test mode B of the semiconductor memory of FIG. 1.
Figure 7B:
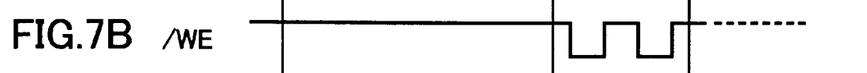
Figure 7C:
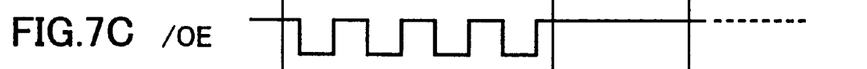
Figure 7D:
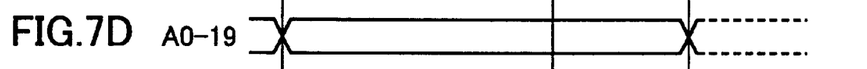
Figure 7E:
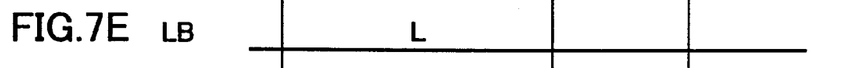
Figure 7F:
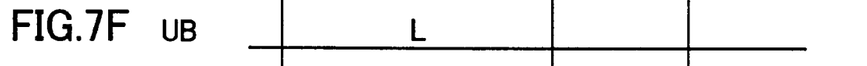
Figure 7G:
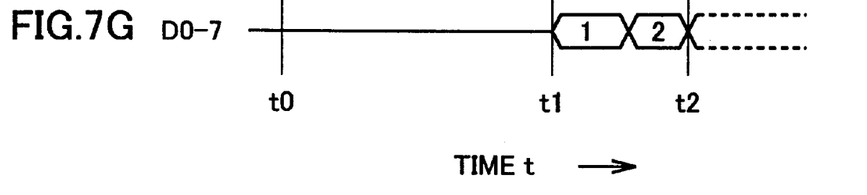

Then, entry to test mode B is implemented by a method identical to that of the user side described with reference to FIG. 7 (time t0–t1). During the test mode set period (time t1–t2), only data signals D0–D3 among data signals D0–D7 are applied from the tester to the semiconductor memory in a predetermined combination and sequence. Accordingly, any signal (for example, TEna) among signals TE1a–TEna is driven to an activation level of H by decoder 16.

In the case where test mode B is set at the manufacturer side, signal TMAm+1 is at the activation level of H. Therefore, logic circuit 18 sets signals TE1a–TEna as signals TMB1–TMBn, respectively. Here, test mode signal TMBn corresponding to signal TEna is driven to the activation level of H. When signal TMBn is driven to an H level, mode n is set (time t2). Then, mode n is executed by clock generation circuit 1 and the like (time t2-).

In the first embodiment, by setting a predetermined mode m+1 of test mode A, any of modes 1–n of test mode B can be set through only data signals D0–D3, irrespective of data signals D4–D7. Therefore, test mode B can easily be set at the manufacturer side with only four data input/output terminals Td0–Td3 among the 16 data input/output terminals Td0–Td15 connected to the tester.

Second Embodiment

Figure 8:
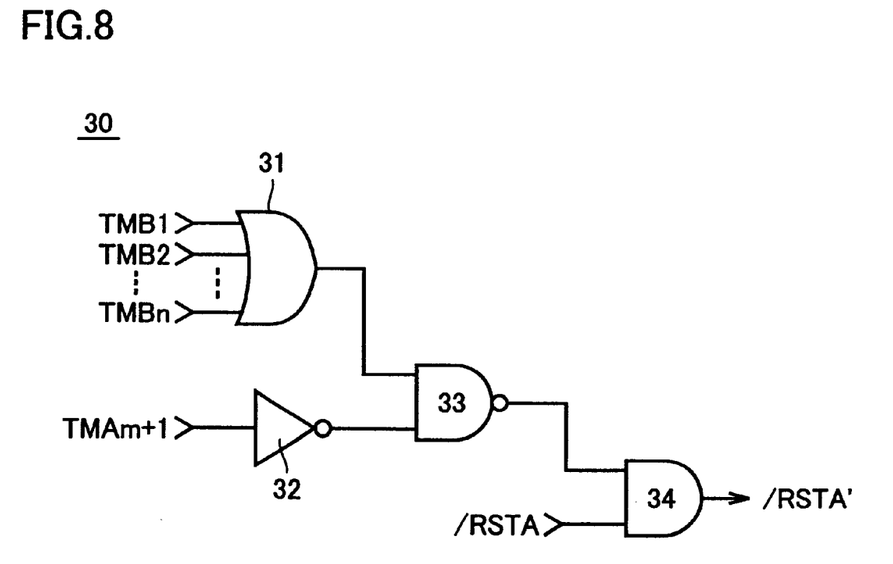
FIG. 8 is a circuit diagram showing a structure of a reset circuit of a semiconductor memory according to a second embodiment of the present invention.

FIG. 8 is a circuit diagram of a main part of a semiconductor memory according to a second embodiment of the present invention. The semiconductor memory of the second embodiment differs from the semiconductor memory of the first embodiment in that a reset circuit 30 to reset address key circuit 13 of FIG. 3 is added.

Reset circuit 30 includes an OR gate 31, an inverter 32, a NAND gate 33 and an AND gate 34. OR gate 31 receives test mode signals TMB1–TMBn. The output signal of OR gate 31 is applied to one input node of NAND gate 33. Test mode signal TMAm+1 is applied to the other input node of NAND gate 33 via inverter 32. AND gate 34 receives the output signal of NAND gate 33 and a reset signal /RSTA. Output signal /RSTA' of AND gate 34 is applied to address key circuit 31 instead of signal /RSTA.

In a normal operation, test mode signals TMB1–TMBn and TMAm+1 are driven to an inactivation level of L, and reset signal /RSTA is driven to an inactivation level of H. Signal /RSTA' is driven to an inactivation level of H.

When test mode B is set at the user side, any of test mode signals TMB1–TMBn attains an activation level of H, and test mode signal TMAm+1 attains an inactivation level of L. In response, the output signal of OR gate 31 attains an H level, and the output signal of NAND gate 33 attains an L level. Output signal /RSTA' of AND gate 34 is driven to an L level, whereby address key circuit 13 is reset. Thus, address key circuit 13 is reset when test mode B is set at the user side because test mode A must be canceled when the semiconductor memory is set to test mode A by chance.

When transition from test mode A to test mode B is effected at the manufacturer side, any of test mode signals TMB1–TMBn is driven to an activation level of H, and test mode signal TMAm+1 is driven to an activation level of H. In response, inverter 32 provides an output signal of an L level and NAND gate 33 provides an output level of an H level. Output signal /RSTA' of AND gate 34 remains at the H level, so that address key circuit 13 is not reset. Thus, in the transition from test mode A to test mode B, address key 13 is not reset even if test mode B is set. This is because reset of address key circuit 13 causes test mode signal TMAm+1 to be driven to an inactivation level of L, whereby test mode signals TMB1–TMBn are driven to an inactivation level of L by logic circuit 18 to cancel test mode B.

Figure 9:
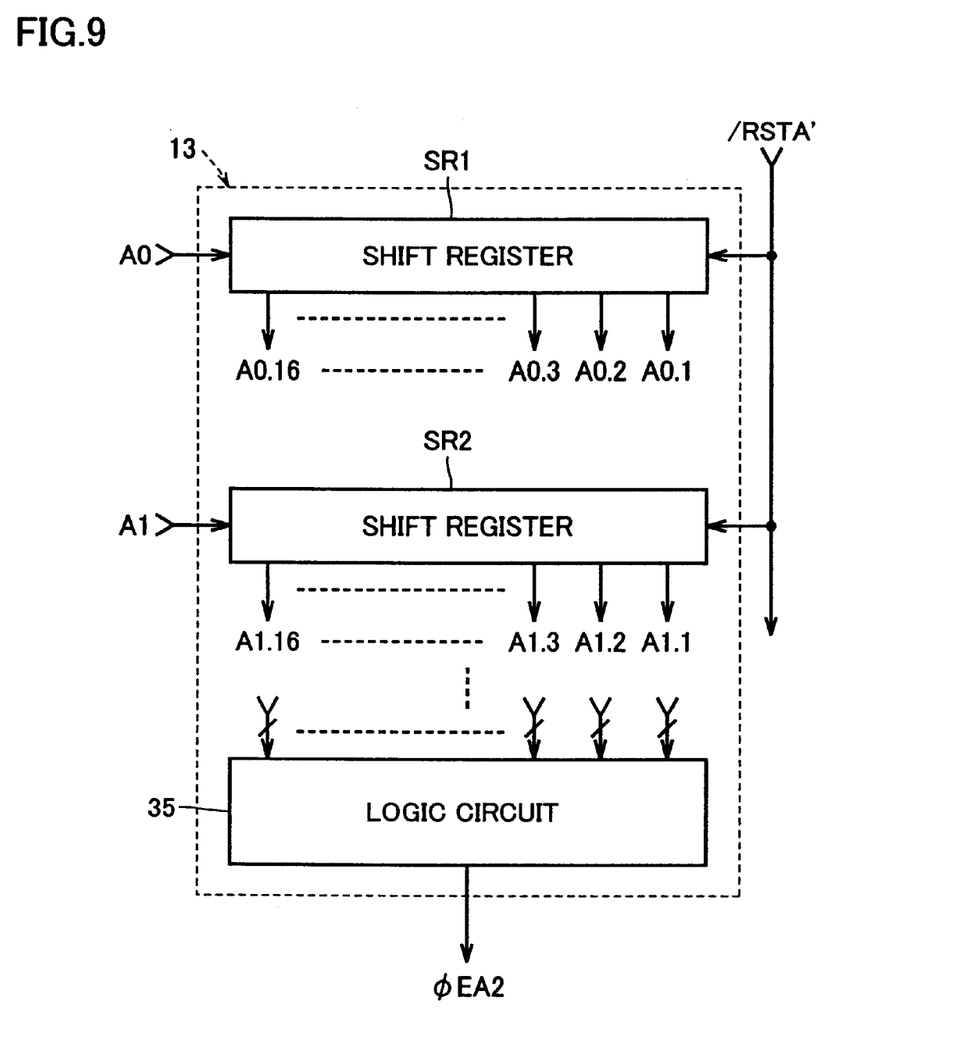
FIG. 9 is a block diagram showing a structure of an address key circuit of the semiconductor memory of FIG. 8.

The structure of address key circuit 13 will be described here. Referring to FIG. 9, address key circuit 13 includes shift registers SR1, SR2, . . . provided corresponding to address signals A0, A1, and A3–A19, respectively, and a logic circuit 35. Shift register SR1 converts the 16 address signals A0.1–A0.16 input in series during test mode entry periods 1, 2 (refer to FIG. 4) into parallel address signals A0.1–A0.16 for output. Shift register SR1 also resets signals A0.1–A0.16 to an L level in response to reset signal /RSTA' driven to an activation level of L. The same applies to the other shift registers SR2, . . . Logic circuit 35 drives signal EA2 to an activation level of H in response to output signals A0.1–A0.16, A1.1–A1.16, . . . of all shift registers SR1, SR2, . . . set to a predetermined combination.

Figure 10:
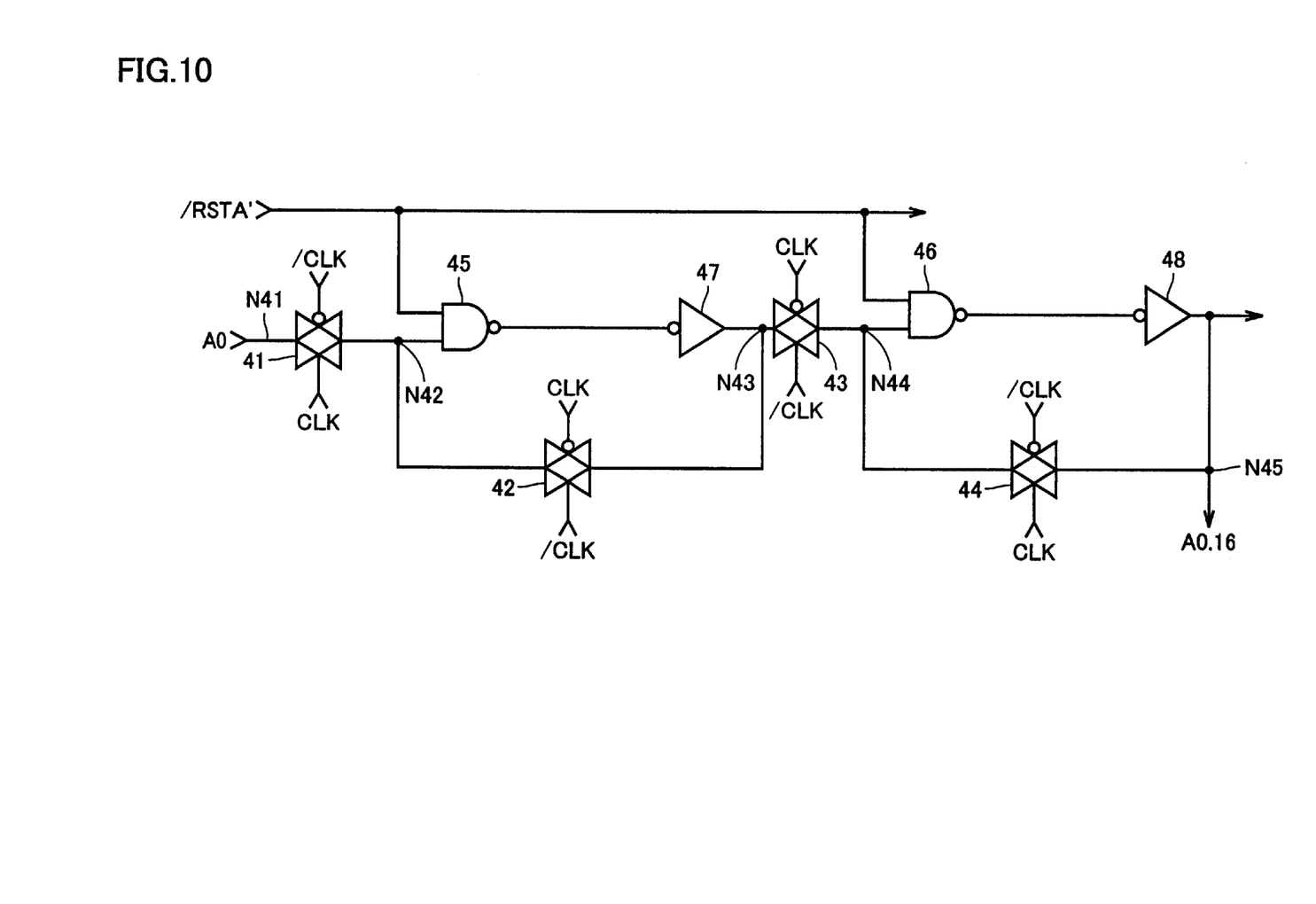
FIG. 10 is a circuit diagram showing a main part of the shift register of FIG. 9.

FIG. 10 is a circuit diagram of the portion related to signal A0.16 of shift register SR1. Referring to FIG. 10, shift register SR1 includes transfer gates 41–44, NAND gates 45 and 46, and inverters 47 and 48. Transfer gates 41–44 are connected in series between an input node N41 of address signal A0 and an output node N45 of signal A0.16. Transfer gates 41 and 44 are rendered conductive during the H level period of clock signal CLK. Transfer gates 42 and 43 are rendered conductive during the L level period of clock signal CLK. Clock signal CLK has a frequency identical to that of address signal A0.

NAND gate 45 receives reset signal /RSTA' at one input node. The other output node of NAND gate 45 is connected to a node N42 between transfer gates 41 and 42. The signal output from NAND gate 45 is applied to a node N43 between transfer gates 42 and 43 via inverter 47. NAND gate 46 has one input node receiving reset signal /RSTA' and the other input node connected to a node N44 between transfer gates 43 and 44. The output signal of NAND gate 46 is provided to node 45 via inverter 48.

When reset signal /RSTA' is at an inactivation level of H, NAND gates 45 and 46 operate as inverters with respect to signals appearing on nodes N42 and N44, respectively. During the H level period of clock signal CLK, transfer gates 41 and 44 are rendered conductive whereas transfer gates 42 and 43 are rendered nonconductive. The logic level of address signal A0 is received at node N43 via transfer gate 41, NAND gate 45 and inverter 47. Also, the logic level of address signal A0 latched through transfer gate 44, NAND gate 46 and inverter 48 is transmitted to the next stage.

During the L level period of clock signal CLK, transfer gates 42 and 43 are rendered conductive whereas transfer gates 41 and 44 are rendered nonconductive. The logic level of address signal A0 latched through transfer gate 42, NAND gate 45 and inverter 47 is transmitted to node 45 via transfer gate 43, NAND gate 46 and inverter 48. Thus, the logic level of address signal A0 is received at shift register SR1 in synchronization with clock signal CLK.

When reset signal /RSTA' is driven to an activation level of L, NAND gates 45 and 46 provide output signals of an H level, and inverters 47 and 48 provide output signals of an L level. The portion related to address signals A0.15–A0.1 are similar to the aforementioned portion related to address signal A0.16.

Since address key circuit 13 is reset when test mode B is set at the user side in the second embodiment, test mode A can be canceled automatically even in the case where the semiconductor memory is set to test mode A by chance. Since address key circuit 13 is not reset when test mode B is set at the manufacturer side, the problem of test mode A being canceled and then test mode B canceled can be prevented.

Third Embodiment

Figure 11:
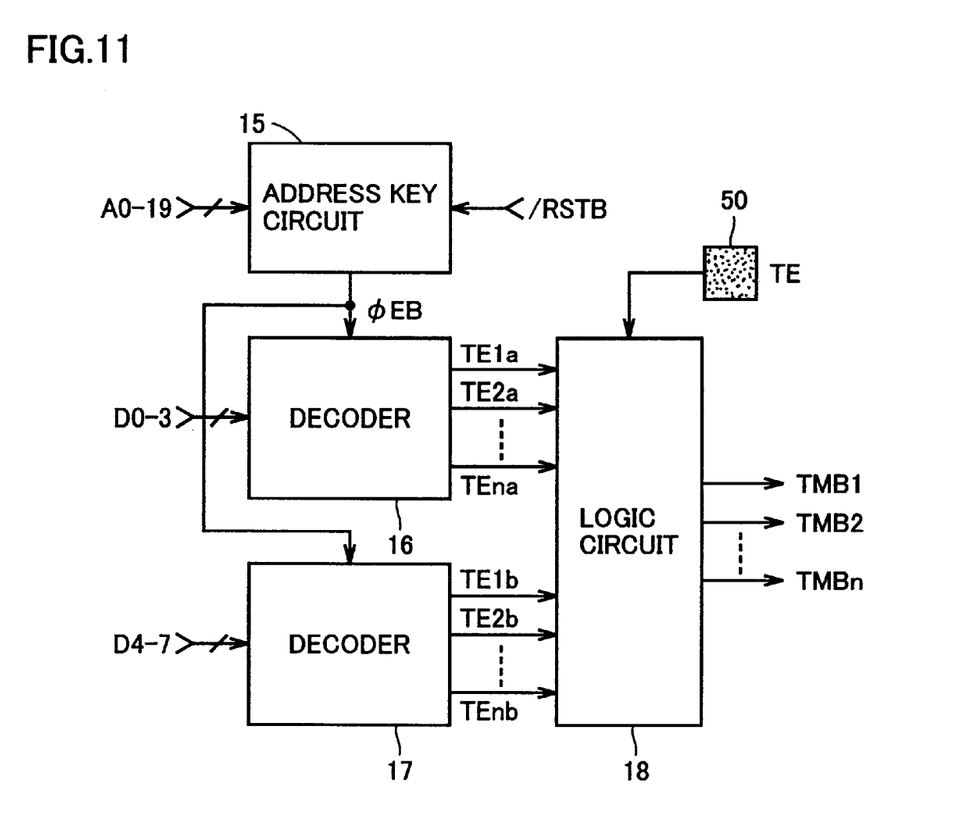
FIG. 11 is a block diagram showing a main part of a semiconductor memory according to a third embodiment of the present invention.

FIG. 11 is a block diagram showing a main part of a semiconductor memory according to a third embodiment of the present invention. The semiconductor memory of FIG. 11 differs from the semiconductor memory of the first embodiment in that a pad 50 is added. Test signal TE is applied to pad 50. Test signal TE applied to pad 50 is provided to logic circuit 18 instead of test mode signal TMAm+1. This pad 50 is used in the case where the semiconductor memory is tested in a wafer status at the manufacturer side. In this case, terminals for external control signals /CE, /WE, /OE, /LB and UB of the semiconductor memory, terminals Ta0–Ta19 for address signals A0–A19, and 4 data input/output terminals Ts0–Td3 among the 16 data input/output terminals Td0–Td15 are connected to the tester.

In the case where test mode B is set at the manufacturer side, test signal TE is at an H level. Logic circuit 18 takes output signals TE1a–TEna from decoder 16 as test mode signals TMB1–TMBn, respectively. Accordingly, test mode B can be set using only four data input/output terminals T0–T13 among the 16 data input/output terminals T0–T15. When testing at the manufacturer side is completed, test signal TE is fixed at an L level. This can be effected by, for example, connecting pad 50 to the line of ground potential GND through bonding wire.

When pad 50 is driven to an H level in the third embodiment, any of modes 1–n of test mode B can be set using only data signals D0–D3 irrespective of data signals D4–D7. Therefore, test mode B can easily be set at the manufacturer side by connecting only four data input/output terminals Td0–Td3 among 16 data input/output terminals Td0–Td15 to the tester.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device carrying out a predetermined operation according to a signal applied through a plurality of first signal terminals, a plurality of second signal terminals, and a plurality of third signal terminals, said semiconductor device comprising:

a first select circuit selecting any of a plurality of first test modes according to a signal applied through said plurality of first signal terminals;

a second select circuit selecting any of a plurality of second test modes according to a signal applied through said plurality of second signal terminals;

a third select circuit selecting any of said plurality of second test modes according to a signal applied through said plurality of third signal terminals;

a fourth select circuit selecting the second test mode selected by the second select circuit and said third select circuit when a control signal is at a first level, and selecting the second test mode selected by said second select circuit when said control signal is at a second level; and a test mode execution circuit executing the first test mode selected by said first select circuit and the second test mode selected by said fourth select circuit.

2. The semiconductor device according to claim 1, wherein said first select circuit drives said control signal to the second level and to the first level when a predetermined first test mode is selected from said plurality of first test modes, and when a first test mode other than said predetermined first test mode is selected, respectively.

3. The semiconductor device according to claim 1, further comprising a fourth signal terminal to input said control signal.

4. The semiconductor device according to claim 1, further comprising:

a first signal generation circuit driving a first activation signal to an activation level in response to application of a predetermined first signal through said plurality of first signal terminals; and a second signal generation circuit driving a second activation signal to an activation level in response to application of a predetermined second signal through said plurality of first signal terminals, wherein said first select circuit is rendered active in response to said first activation signal driven to an activation level, and wherein said second and third select circuits are rendered active in response to said second activation signal driven to an activation level.

5. The semiconductor device according to claim 4, further comprising a reset circuit resetting said first signal generation circuit in response to selection of any of said plurality of second test modes, and driving said first activation signal to an inactivation level.

6. The semiconductor device according to claim 5, wherein said reset circuit does not reset said first signal generation circuit when said control signal is at the second level.

7. The semiconductor device according to claim 1, said semiconductor device being a semiconductor memory device, wherein said semiconductor memory device comprises a plurality of memory circuits, each preassigned a unique address signal, a decoder selecting any of said plurality of memory circuits according to an address signal applied through an address signal input terminal group, and a data input/output circuit transferring a data signal between a data input/output terminal group and said memory circuit selected by said decoder, said address signal input terminal group including said plurality of first signal terminals, said data input/output terminal group including said plurality of second signal terminals and said third signal terminals, said test mode execution circuit executing testing of said semiconductor memory device.

* * * * *